（12） United States Patent
Shamsoddini

(10) Patent No.: US 10,811,764 B2
(45) Date of Patent: Oct. 20, 2020

(54) WIRELESS WEARABLE ELECTRONIC DEVICE COMMUNICATIVELY COUPLED TO A REMOTE DEVICE

(71) Applicant: Logitech Europe S.A., Lausanne (CH)

(72) Inventor: Ahmad Shamsoddini, Cupertino, CA (US)

(73) Assignee: LOGITECH EUROPE S.A., Lausanne (CH)

( * ) Notice: Subject to any disclaimer, the term of this patent is extended or adjusted under 35 U.S.C. 154(b) by 103 days.

(21) Appl. No.: 15/912,133

(22) Filed: Mar. 5, 2018

(65) Prior Publication Data

US 2018/0254546 A1    Sep. 6, 2018

Related U.S. Application Data

(60) Provisional application No. 62/466,373, filed on Mar. 3, 2017.

(51) Int. Cl.
| | | |
|---|---|---|
| *H01Q 1/27* | (2006.01) | |
| *H01Q 7/00* | (2006.01) | |
| *H04B 1/3827* | (2015.01) | |
| *H01Q 9/26* | (2006.01) | |
| *H01Q 1/48* | (2006.01) | |
| *H05K 1/14* | (2006.01) | |
| *H05K 5/00* | (2006.01) | |

(Continued)

(52) U.S. Cl.
CPC .............. *H01Q 1/273* (2013.01); *H01Q 7/00* (2013.01); *H01Q 9/265* (2013.01); *H04B 1/385* (2013.01); *H01Q 1/2291* (2013.01); *H01Q 1/48* (2013.01); *H05K 1/14* (2013.01); *H05K 1/18* (2013.01); *H05K 5/0086* (2013.01); *H05K 5/0091* (2013.01); *H05K 2201/10098* (2013.01)

(58) Field of Classification Search
CPC    H01Q 7/00; H01Q 1/48; H01Q 1/273; H01Q 1/2291; H01Q 9/265; H04B 1/385; H05K 2201/10098; H05K 5/0086; H05K 5/0091; H05K 1/18; H05K 1/14
See application file for complete search history.

(56) References Cited

U.S. PATENT DOCUMENTS

| | | | | |
|---|---|---|---|---|
| 6,087,988 | A | * | 7/2000 | Pozgay .................... H01Q 1/38 343/700 MS |
| 6,404,394 | B1 | * | 6/2002 | Hill ........................ H01Q 1/243 343/700 MS |
| 10,128,572 | B2 | * | 11/2018 | Caratelli ............. H01Q 9/0407 |

(Continued)

OTHER PUBLICATIONS

The ARRL Antenna Book by the American Radio Relay League. (Year: 1988).*

*Primary Examiner* — Awat M Salih
(74) *Attorney, Agent, or Firm* — Patterson & Sheridan, LLP

(57) ABSTRACT

Disclosed is a wireless wearable electronic device having an antenna that communicatively couples the wearable electronic device to another wearable electronic device and to a remote, portable device. The antenna is generally shaped like a loop or ring, has a bow with respect to the plane of the loop or ring and operates in conjunction with the ground planes of the printed circuit boards in proximity to the antenna to form a principal omni-directional lobe about the ear of the user and a secondary lobe downwardly directed from the head of the user to communicate with the remote device.

20 Claims, 14 Drawing Sheets

(51) Int. Cl.
*H05K 1/18* (2006.01)
*H01Q 1/22* (2006.01)

(56) References Cited

U.S. PATENT DOCUMENTS

| | | | | |
|---|---|---|---|---|
| 2002/0158803 A1* | 10/2002 | Hill | ............... | H01Q 9/0421 |
| | | | | 343/702 |
| 2004/0051666 A1* | 3/2004 | Aisenbrey | ............ | B29C 45/0013 |
| | | | | 343/700 MS |
| 2013/0050050 A1* | 2/2013 | Zhu | ............... | H01Q 1/2283 |
| | | | | 343/866 |
| 2015/0295314 A1* | 10/2015 | Oh | ............... | H01Q 1/243 |
| | | | | 343/866 |
| 2015/0380826 A1* | 12/2015 | Yang | ............... | H01Q 9/28 |
| | | | | 343/846 |
| 2016/0148752 A1* | 5/2016 | Moon | ............... | H04B 5/0087 |
| | | | | 343/867 |
| 2017/0179599 A1* | 6/2017 | Bevelacqua | ......... | H01Q 9/0407 |
| 2017/0196480 A1* | 7/2017 | Pahima | ............... | A61B 5/062 |
| 2018/0026330 A1* | 1/2018 | Wu | ............... | H01Q 3/242 |
| | | | | 343/703 |
| 2018/0205134 A1* | 7/2018 | Khan | ............... | H01Q 23/00 |

\* cited by examiner

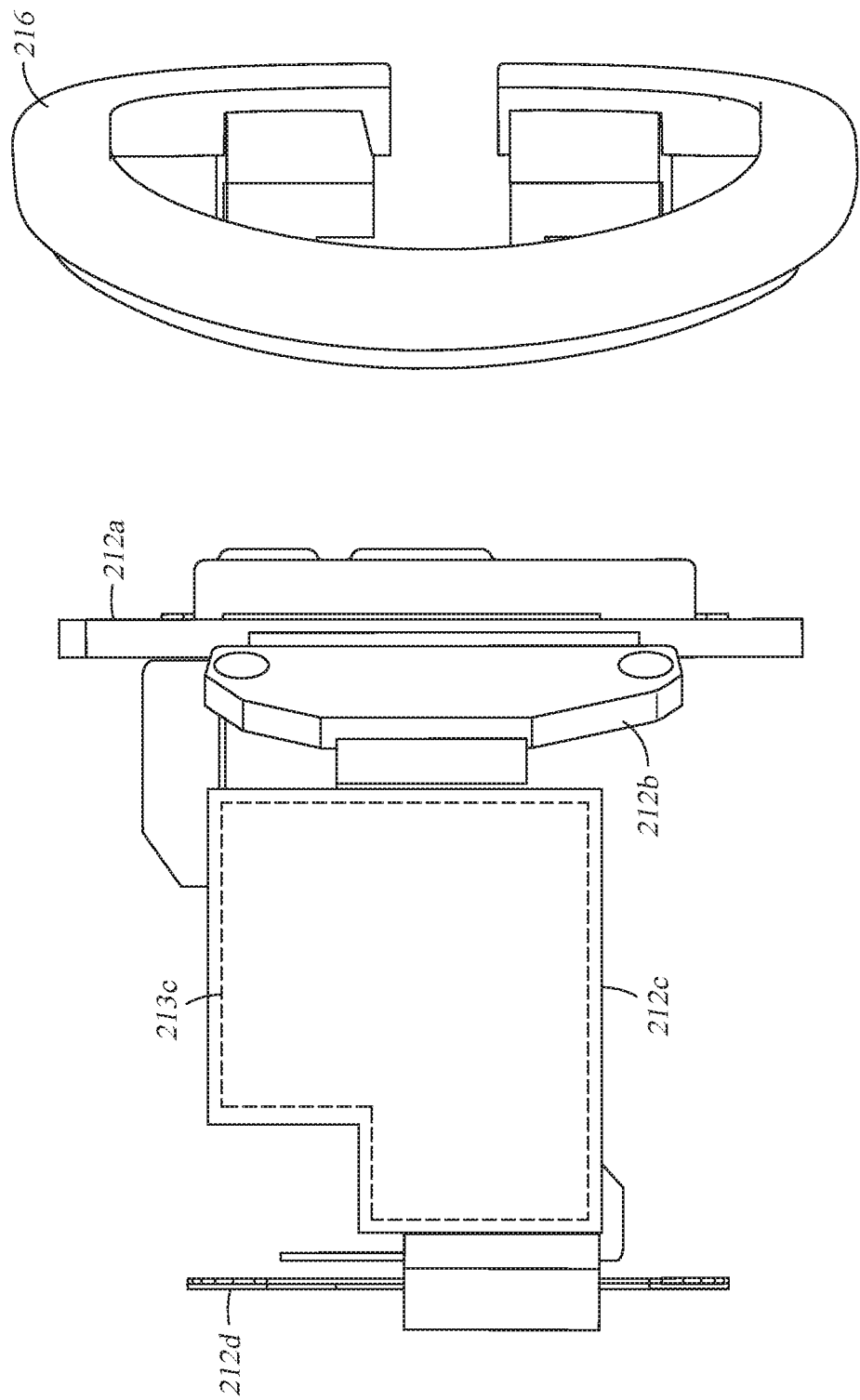

WIRELESS WEARABLE ELECTRONIC DEVICE COMMUNICATIVELY COUPLED TO A REMOTE DEVICE

CROSS-REFERENCE TO RELATED APPLICATIONS

This application claims the benefit of U.S. Provisional Application Ser. No. 62/466,373, filed Mar. 3, 2017, which are both incorporated by reference in its entirety.

BACKGROUND OF THE INVENTION

Field of the Invention

Embodiments of the present disclosure relate to a wireless wearable electronic device or system that can be communicatively coupled to one or more wireless electronic devices.

Description of the Related Art

Wearable electronic devices continue to grow in popularity and have become an integral part of personal communication today. These devices may allow users to wirelessly receive high-fidelity audio data for playback and may also track a user's fitness level, for example, by counting the user's steps, total calories burned, miles run, etc., and by monitoring the user's heart rate almost anywhere they travel.

As wearable electronic device technology has increased, so too has the functionality of wearable electronic devices. In some configurations, wearable electronic devices allow users to electronically transmit and receive information between the wearable electronic device and various external electronic devices, such as cellular phones, personal computers, internet devices, video players, gaming devices, music playing platforms or other types of devices. Wearable electronic devices may allow users to be un-tethered to the external electronic device while allowing communication to occur between the external electronic device and the wearable electronic device so that the user can move around and/or perform some physical activity. As such, such multi-functional wearable devices may require users to wirelessly access the Internet via a cellular network, Bluetooth connections and/or a wireless local area network (WLAN), for example.

As the functionality of wearable electronic devices continues to increase, so too does the demand for smaller devices which are easier and more convenient for users to carry. One challenge this poses for wearable device manufacturers is designing devices that are able form a reliable communication link between the wearable electronic device and other electronic components, such as one or more external electronic devices. Included in the communications link are electronic data transmitting antennas. These antennas are configured so that they have desired operating characteristics while maintaining the small form factor of the wearable electronic device and minimal weight. It is a challenge to designers to form an antenna that can reliably form a communication link between electronic devices while maintaining the small form factor using typical RF frequencies allotted for most wireless communication technologies today, for example communication at Bluetooth frequencies (e.g., between 2.402 GHz and 2.480 GHz).

One kind of wearable electronic devices, or wireless ear buds, pose a special challenge to designers. These devices must be sized to fit in and upon an ear of the user in a comfortable manner, which necessitates that the device be quite small. A wireless device that is small not only constrains the placement of electrical components in the device but also the size and shape of an antenna included therein. However, an antenna so constrained must still operate without compromising communication reliability and range at a given operating frequency, as the antenna typically must communicate with other similar devices (e.g., an ear bud positioned in the user's other ear) as well as with other remote electronic devices, such as a smart phone. Thus, in this case, it is important that the antenna's radiation pattern cover both ears of the user as well as the remote electronic device that may be positioned locally relative to the user's body. Therefore, there is a need for a wireless electronic device that solves the problems described above.

SUMMARY OF THE INVENTION

Embodiments of the disclosure may include a wireless wearable electronic device. The wireless wearable electronic device includes a printed circuit board assembly, a transceiver, and an antenna. The printed circuit board assembly includes a first printed circuit board having a first ground plane and a second printed circuit board having a second ground plane, where the second ground plane is electrically connected with the first ground plane and disposed at an angle to the first ground plane. The antenna has a loop shape and a first feed point and a second feed point that are spaced a distance apart along the loop shape. The antenna is disposed over the first printed circuit board and is coupled to the first ground plane at the first feed point and to the transceiver at the second feed point, and the first ground plane and the antenna are positioned to form a gap therebetween. The formed gap and the position of the antenna relative to the first ground plane are adapted to form a principal radiation lobe that is parallel to a first plane when an electromagnetic radiation signal is provided to the antenna from the transceiver.

Embodiments of the disclosure may further include a wireless wearable electronic device comprising a first printed circuit board assembly that includes a first printed circuit board having a first ground plane and a second printed circuit board having a second ground plane, wherein the second ground plane is electrically connected to the first ground plane and is disposed at an angle to the first ground plane, a first transceiver, and a first antenna having a circular, oval or elliptical shape and a first feed point and a second feed point that are spaced a distance apart along the circular, oval or elliptical shape. The wireless wearable electronic device may further include a third printed circuit board assembly that includes a third printed circuit board having a third ground plane and a fourth printed circuit board having a fourth ground plane, wherein the fourth ground plane is electrically connected to the third ground plane and is disposed at an angle to the third ground plane, a second transceiver, and a second antenna having a circular, oval or elliptical shape and a first feed point and a second feed point that are spaced a distance apart along the circular, oval or elliptical shape. The first antenna and the second antenna may each have a bow relative to a plane, wherein the bow is configured to enhance the communication of the transceiver and the additional transceiver during use. The first antenna is disposed over the first ground plane and is coupled to the first ground plane at the first feed point and to the transceiver at the second feed point, and the first ground plane and the antenna are positioned to form a gap therebetween. The second antenna is disposed over the third ground plane and is coupled to the third ground plane at the first feed point and to the transceiver at the second feed point, and the third ground plane and the antenna are positioned to form a gap therebetween.

Embodiments of the disclosure may further include a wireless wearable electronic device that includes: a printed circuit board assembly that includes a first printed circuit board having a first ground plane, wherein the first printed circuit board is disposed over a face of a battery and a second printed circuit board having a second ground plane that is in electrical communication with the first ground plane, wherein the second ground plane is electrically connected with the first ground plane, is disposed at an angle to the first ground plane and is disposed along a length of the battery; a transceiver; and an antenna having a loop shape, and a first feed point and a second feed point that are spaced a distance apart along the loop shape, wherein the antenna is disposed over the first printed circuit board and is coupled to the first ground plane at the first feed point and to the transceiver at the second feed point, and the first ground plane and the antenna are positioned to form a gap therebetween, and wherein the formed gap and the position of the antenna relative to the first ground plane are adapted to form a principal radiation lobe that is parallel to a first plane when an electromagnetic radiation signal is provided to the antenna from the transceiver.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 9A and 9B depict second side views of the antenna and printed circuit boards, according to one or more embodiments of the present disclosure.

Figure 1:
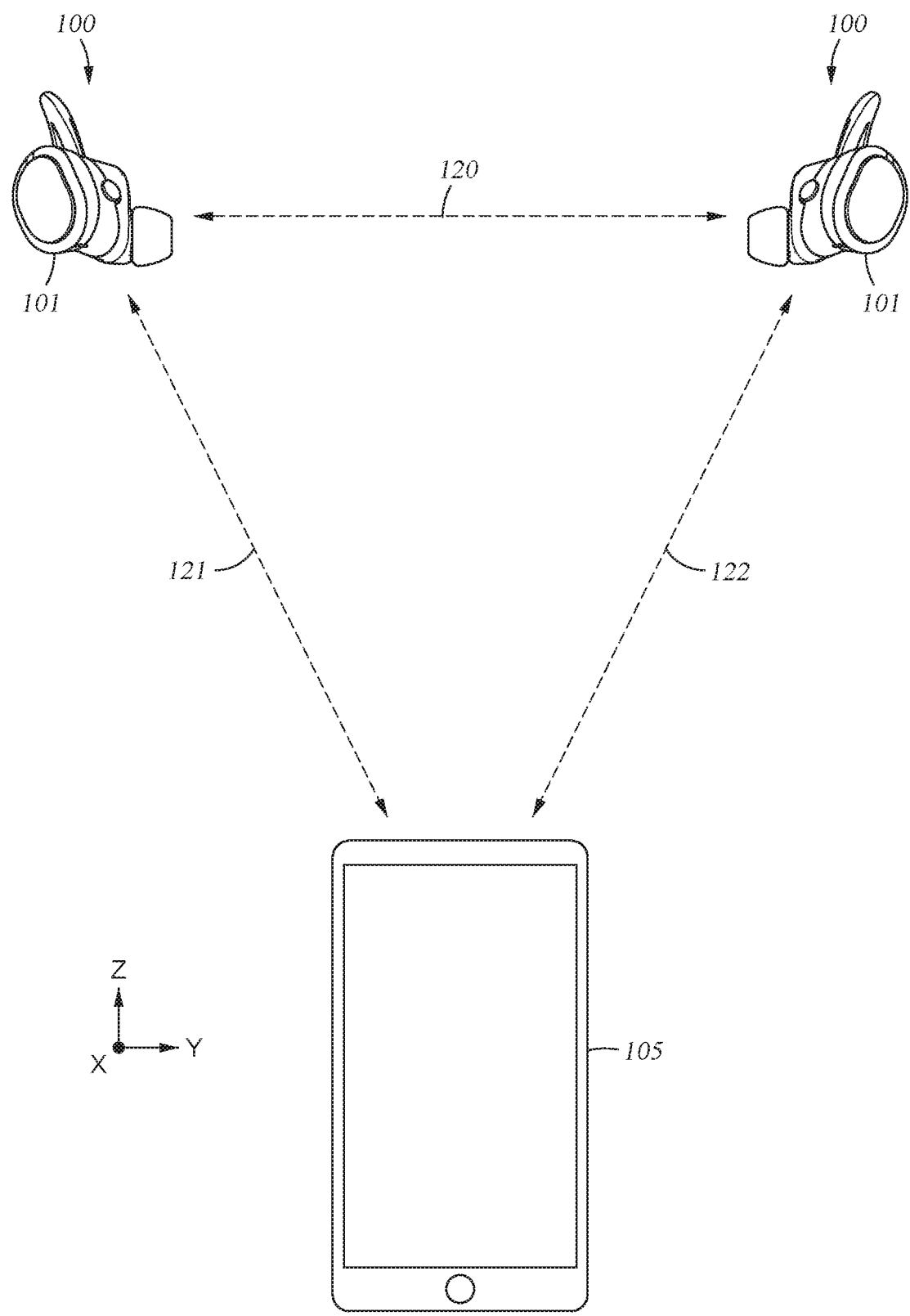
FIG. 1 depicts an example of a pair of wireless devices and a portable device to which the wireless devices are communicatively linked, according to one or more embodiments of the present disclosure.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

The technology disclosed herein is directed towards a wireless wearable electronic device, or hereafter referred to as a wireless earpiece or a wireless device, that provides an audible signal to the user and has an antenna that has a radiation pattern that communicatively couples with other electronic devices, such as another earpiece and/or a remote wireless device. There is a long-felt need for a wireless earpiece that is sleek, mobile, and lightweight. In one embodiment of the disclosure, in which the wearable device is a wearable fitness-monitoring device, being sleek, mobile, lightweight, and/or rugged allows a user to perform numerous activities while wearing the device. Moreover, the antenna designed disclosed herein enable the transmission and collection of data, such as data relating to the user's activity and the user's physical responses thereto, via a wireless communication technique, thus enabling the user to better track a multitude of fitness-and-health related data points. Additionally, there is a long-felt-need for wearable devices that are simple and cheap to manufacture.

FIG. 1 depicts an example of a pair of wireless devices 101 and a remote device 105. Each wireless device 101, which may be placed in one ear of a user, is configured to be communicatively coupled via electromagnetic communication link 120 to a similar wireless device 101 placed in the user's other ear and via communication links 121 and 122 to a remote device 105 as shown. In one embodiment, the communicative coupling occurs in accordance with the Bluetooth™ standard, which is a low energy (i.e., Class 2) protocol, which in the U.S. transmits and receives in a frequency range from 2.400 GHz to 2.4835 GHz. Within this frequency range, the protocol operates 78 channels, each spaced apart from an adjacent channel by 1 MHz. The approximate 2.4 GHz frequency implies a wavelength λ of about 125 mm (i.e., about 5 inches) and the number of channels implies a needed bandwidth of about 80 MHz.

Figure 2:
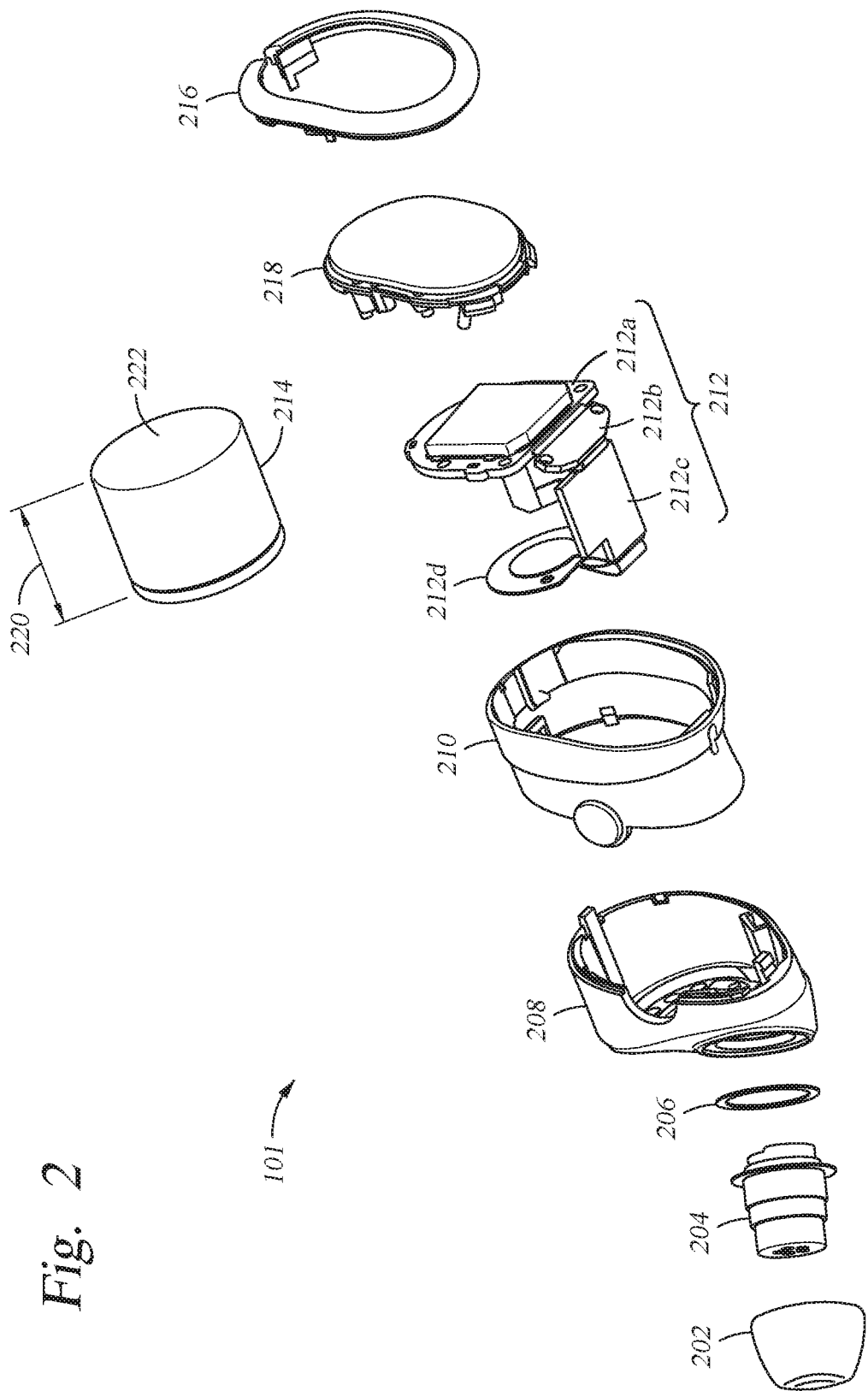
FIG. 2 depicts an exploded view of the wireless device, according to one or more embodiments of the present disclosure.

FIG. 2 depicts an exploded view of the wireless device 101, also referred to herein as simply wireless earpiece or earpiece, according to one or more embodiments of the present disclosure. In the embodiment, the wireless earpiece includes a soft member 202, a speaker assembly 204, a spacer 206, a speaker housing 208, a battery 214, a printed circuit board assembly 212, a circuit board housing 210, an antenna 216, and a cover 218. The speaker assembly 204 is attached to the speaker housing 208 via the spacer 206 and is covered by the soft member 202, which is configured to fit within the ear canal of the user.

The battery 214 generally has a shape with two end faces and a length. In one embodiment, the battery has a cylindrical shape, with the end faces being the ends of the cylinder, and a length 220 being the length of the cylinder, but other three dimensional battery shapes, such as a cubic shape, can also be used.

In one embodiment, the printed circuit board assembly 212 includes multiple printed circuit boards, which are disposed about the battery 214, with the printed circuit boards and battery being contained within housing 210. The printed circuit boards in the printed circuit board assembly include a radial printed circuit board 212a disposed over one of the end faces 222 of the battery 214, a switch printed circuit board 212b disposed at an angle to the radial printed circuit board 212a between one of the end faces and the length 220 of the battery 214, a central printed circuit board 212c disposed along the length 220 of the battery 214, and a connector printed circuit board 212d disposed over the other end face of the battery 214.

Figure 8A:
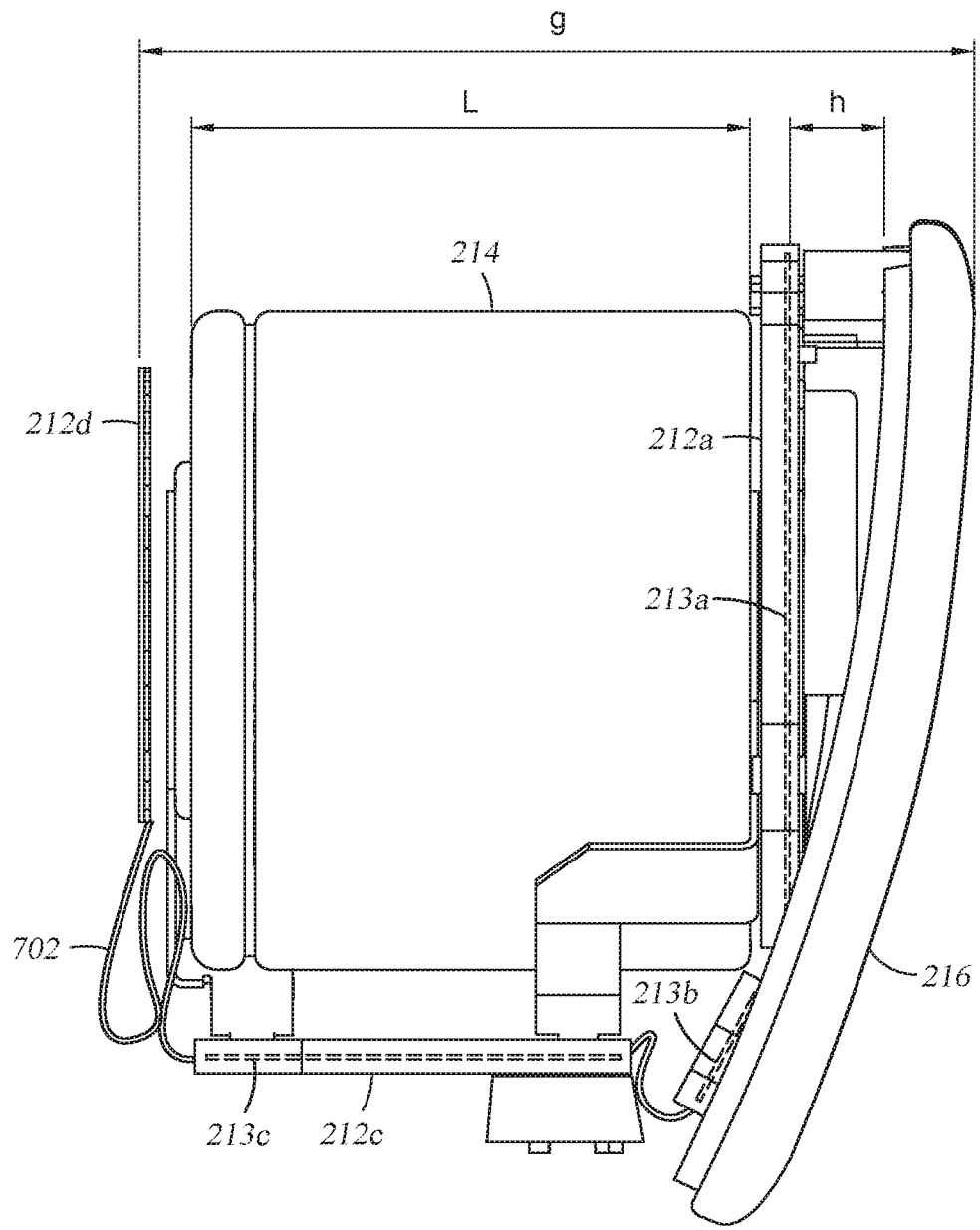
FIGS. 8A and 8B depict first side views of the antenna and printed circuit boards, according to one or more embodiments of the present disclosure.
Figure 8B:
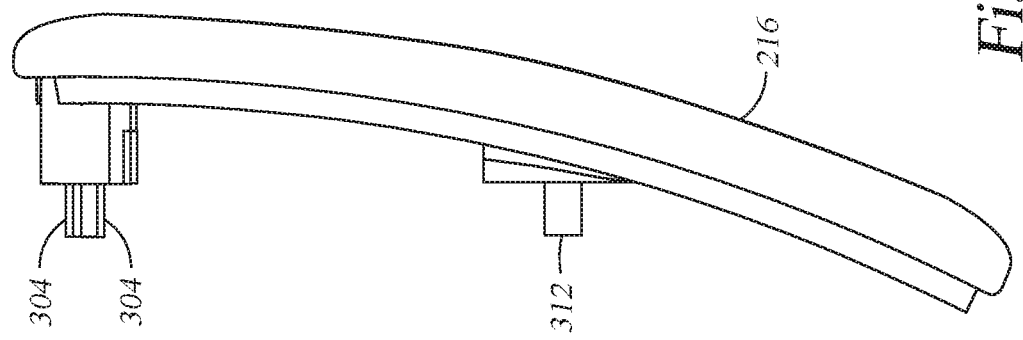
Figure 8B:
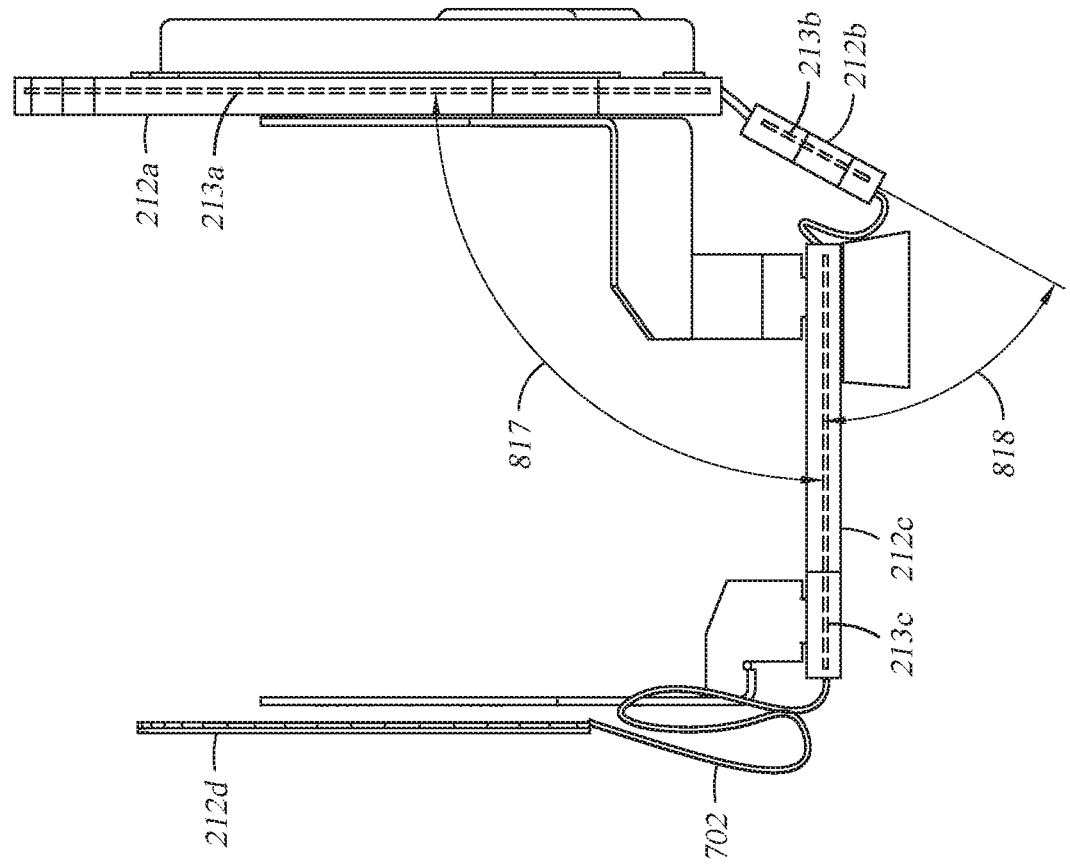

Each of the printed circuit boards 212a-d has a ground plane 213a-d, respectively, and at least one other layer for electrical connections. The ground planes 213a-d of all of the printed circuit boards 212a-d are electrically connected to each other via one or more wires or flex lines, and are also connected to one terminal of the battery 214. As illustrated in FIGS. 8A and 8B, the ground plane 213b present within the switch printed circuit board 212b is disposed at an angle 818 relative to the ground plane 213a present within the radial printed circuit board 212a. The angle 818 may be configured so that a gap "h" (FIG. 8A), which is discussed further below, is maintained between the switch printed circuit board 212b and the antenna 216 due to the "bowed" shape (FIG. 5) of the antenna 216. The ground plane 213c formed within the central printed circuit board 212c is disposed at an angle 817 relative to the ground plane 213a formed within the radial printed circuit board 212a. The angle 817 formed between the ground planes 213a and 213c is between about 10° and about 170°, such as between about 80° and 100°, or even about 90°. Speaker driver components mounted on the connector printed circuit board 212d are connected to the speaker assembly 204 held by the speaker housing 208 to provide a signal to drive a speaker (not shown) provided within the speaker assembly 204.

The antenna 216 may be disposed within the wireless device 101 so that the gap "h" (FIG. 8A) is present between the ground plane in the radial printed circuit board 212a, which is disposed over the face 222 of the battery 214. In some configurations, it is desirable to space the antenna 216 as far as physically possible from the ground plane of the radial printed circuit board 212a, and still stay within the envelope of the wireless device 101. In one embodiment, the gap "h" between the antenna 216 and the ground plane 213a of the radial printed circuit board 212a is about 2 to 3.5 millimeters (mm). The gap "h" may be formed so that a desired gap is maintained between the antenna 216 and the closest point on the ground plane 213a in any direction.

Figure 3A:
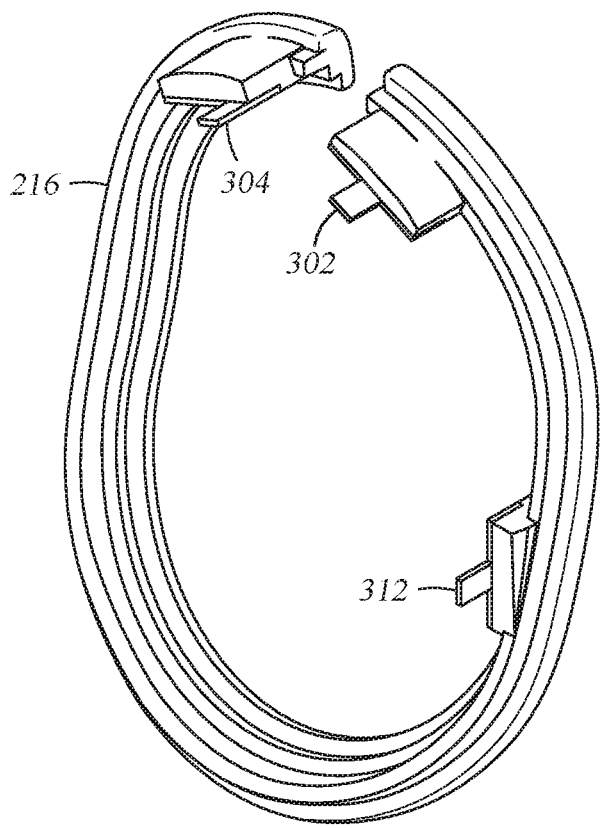
FIGS. 3A and 3B depict first and second isometric views of an antenna, according to one or more embodiments of the present disclosure.
Figure 3B:
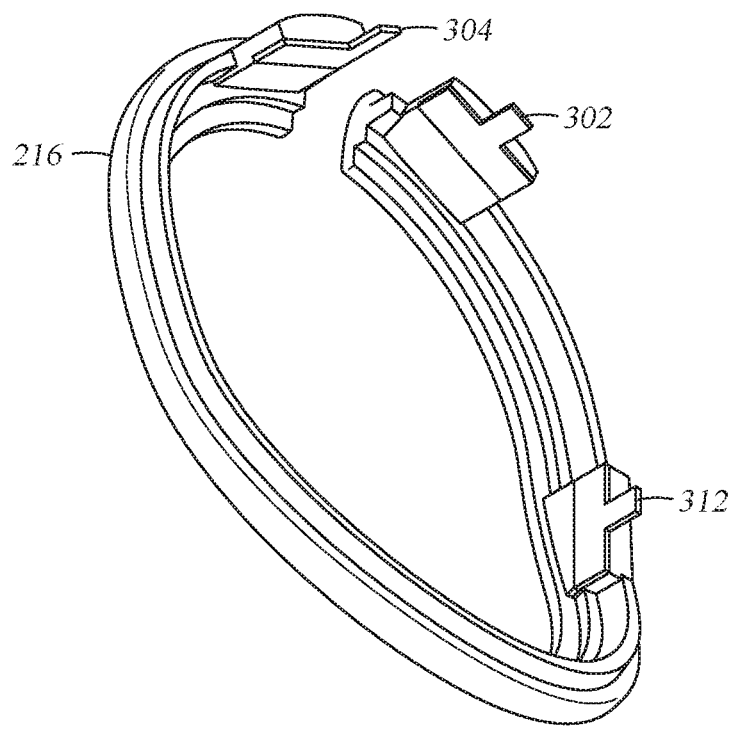
Figure 4A:
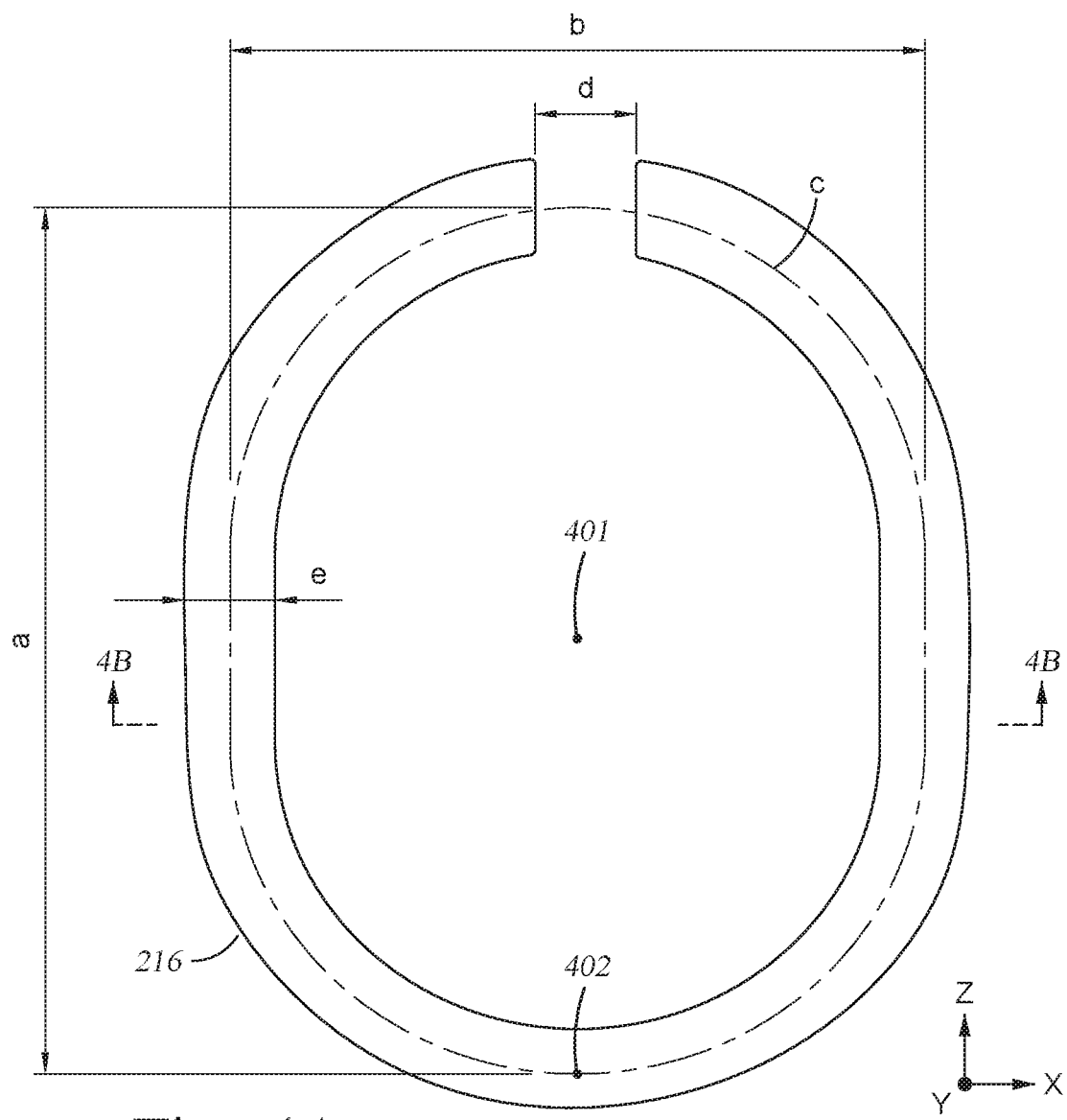
FIGS. 4A and 4B depict a plan and cross-sectional view respectively of the antenna, according to one or more embodiments of the present disclosure.

FIGS. 3A and 3B depict first and second isometric views of the antenna 216. These views show the two antenna feed points 302, 304. One of these feed points is connected to a transceiver device that transmits signal or receives signal from the antenna 216. As illustrated in the figures and described herein, one or more of the embodiments of the antenna 216 have a general loop shape, which includes but is not limited to, shapes where in at least one orientation, such as illustrated in FIG. 4A, the antenna has a two-dimensional (2-D) shape that is a circle, oval, elliptical, polygonal or other desired shape that is either continuous or non-continuous. The various configurations of the antenna 216 described herein, such as a "loop antenna" or "dipole antenna" may have a "loop shape," and thus the phrase "loop shape" is only intended to generally describe an antenna's physical shape in at least in one orientation. In one example, the loop shape of the antenna 216 has a circular, oval or elliptical 2-D shape (e.g., projection of antenna 216 on the X-Z plane in FIG. 4A) that sweeps an angle of between about 340 degrees and about 360 degrees about a central point of the 2-D shape (e.g., central point 401 shown in FIG. 4A).

Figure 4B:
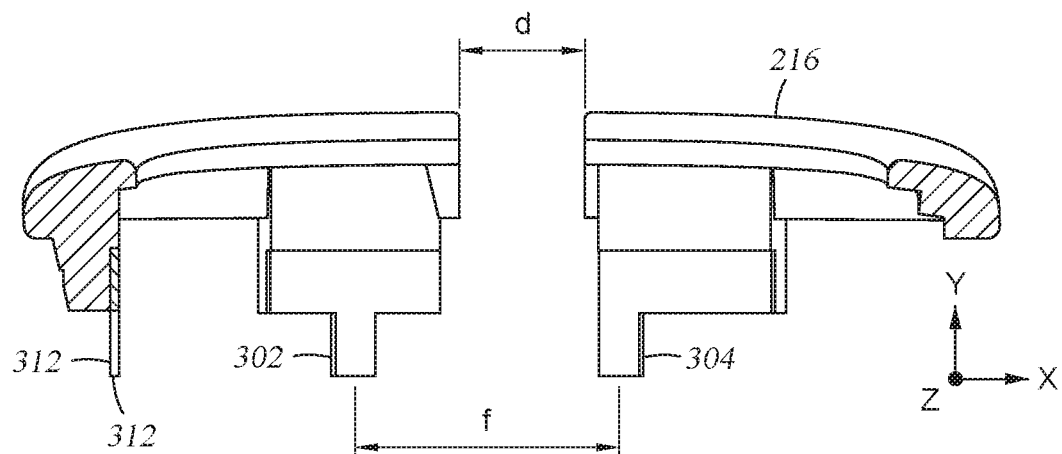

FIGS. 4A and 4B depict a plan view and cross-sectional view respectively of the antenna 216. The view in FIG. 4A has a sectioning line 4B-4B that is parallel to the Y-direction of the antenna to indicate the view in FIG. 4B. The plan view of the antenna in FIG. 4A illustrates an antenna 216, for example, that has a dimension "a" of about 10 mm to about 50 mm in a first direction (e.g., Z-direction) and a dimension "b" of about 10 mm to about 50 mm in a second direction (e.g., Y-direction) orthogonal to the first direction and a thickness of dimension "e". In one embodiment, the perimeter or circumference "c" of the antenna 216, which follows the centerline of the antenna, is between about 30 mm and about 125 mm, such as approximately 120 mm, for example. When dimensions "a" and "b" are different in length, the shape of the antenna 216 is more oval than circular.

In one embodiment, the antenna 216 is electrically continuous about its perimeter between a pair of feed points 302, 304 (FIG. 4B) that are spaced apart by a distance "f". In one configuration, the antenna 216 has a gap "d" that is formed between the pair of feed points 302, 304. In this configuration, when the length between each feed point and a point 402, along the circumference "c" and opposite to the feed points 302, 304, are approximately equal, the antenna can be viewed as a type of dipole antenna as the ends of each portion of the dipole antenna, which are joined at point 402, have equal voltages when driven at the feed points 302, 304. In one embodiment, the length of each leg of the dipole is between about 1 mm and 32 mm, which is close to ¼ of a wavelength ($\lambda/4$) at 2.44 GHz.

In another embodiment, the antenna 216 has a small gap (not shown) that is formed at point 402, and thus is electrically discontinuous about its perimeter. The electrically discontinuous antenna configuration may also be viewed as a type of dipole. In some configurations, the additional gap may include a dielectric material that is used to support the ends of the antenna 216 that are adjacent to the formed additional gap.

Alternatively, the antenna is a continuous loop so as to form a "loop antenna." In this configuration, the antenna 216 may be continuous, and thus does not have a gap "d" formed within the continuous ring shape of the antenna. In some embodiments, the loop antenna has a circumference that is between about 30 mm to about 70 mm, which is approximately one half a wavelength $\lambda/2$ at the operating frequency in the range from 2.400 GHz to 2.4835 GHz. In some embodiments, the loop antenna has a circumference that is between about 50 mm to about 63 mm, such as about 52 mm when the antenna 216 is used in a position that is next to or on a supporting plastic (e.g., dielectric) component (e.g., cover 218 in FIG. 2). It is believed that the desired circumference of the antenna 216 will differ if the antenna 216 is positioned on or adjacent to one or more dielectric supporting components versus when it is positioned in free space. A loop antenna of this size has a radiation pattern that is similar to the dipole antenna and an impedance of about 50 ohms.

In an alternative embodiment, an additional contact point 312 on the antenna 216 can be connected to the ground plane of the printed circuit board, specifically the ground plane of the radial printed circuit board 212a. This connection, if used, can convert the antenna into a tuned loop or dipole antenna, the longer pole (between 304 and 402) running approximately parallel to the ground plane and the shorter pole (between 304 and 402) being connected to the ground plane. This type of antenna has characteristics similar to a dipole.

The physical locations of feed points 302, 304 on the antenna 216 as illustrated in FIG. 4B are finely adjusted to set the precise length of the antenna, such as the circumference "c" less the distance "f", which determines the impedance and transmission and reception bandwidth of the antenna 216, so adjusted. The feed points 302, 304 are generally spaced a desired distance apart along the antenna's loop shape, which can be measured along the centerline of the antenna following the antenna's loop shape (e.g., following the circumference "c" shown in FIG. 4A). In one embodiment, the impedance is tuned to be substantially purely resistive and is approximately 50 ohms at a frequency of 2.4 GHz.

Figure 5:
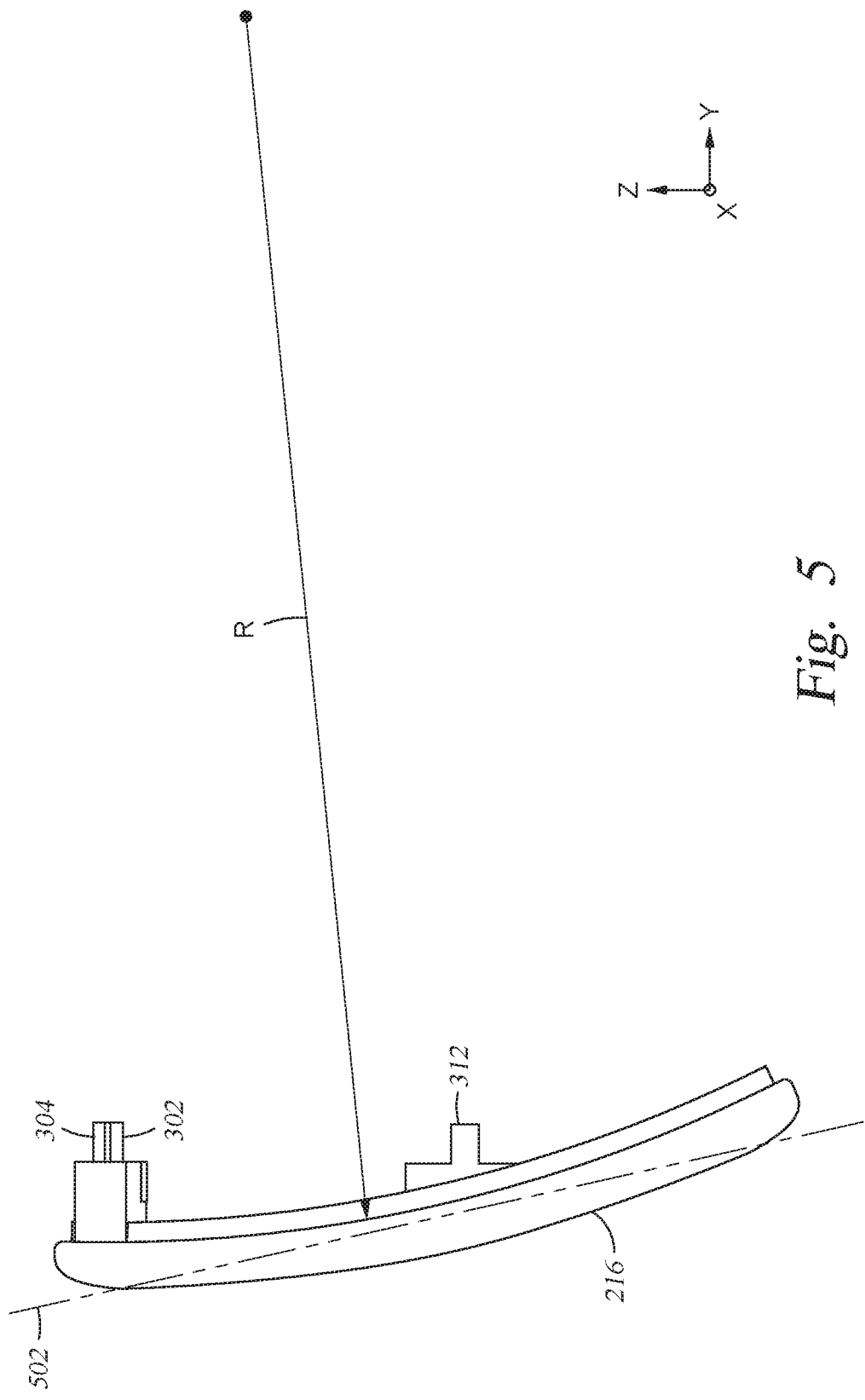
FIG. 5 depicts a view showing a bow formed in the antenna, according to one or more embodiments of the present disclosure.

FIG. 5 depicts a side view showing a bow formed in the antenna 216 according to an embodiment. In some embodiments, as shown in FIGS. 2 through 9B, the antenna has a concave bow with respect to a plane of the antenna, or plane 502, making the antenna non-planar in at least one direction. In some configurations, the plane 502 is perpendicular to a central axis 503, which divides the angular length of the bow of antenna 126 (e.g., arc projected on the Y-Z-plane) in half, and which may also pass through the central point of the projection of the loop shape on a 2-D plane (i.e., central point 401 in FIG. 4A). In some embodiments, the bow has a radius of curvature "R" of between about 0.1 mm and about 50 mm, such as about 20 mm to about 50 mm, or even about 30 mm. In some embodiments, the antenna has a concave bow with respect to a plane of the antenna, or plane 502, and also a plane that is parallel to the Y-Z plane, and thus making the antenna non-planar in at least two directions.

In one embodiment, the antenna 216 is fabricated from a metal, such as stainless steel, copper, aluminum or other metal, with or without a protective non-conductive coating. In another embodiment, the antenna 216 is fabricated from a non-metallic substance that has particles embedded therein to make the antenna conductive. In this embodiment, the non-metallic substance is a plastic and the embedded particles are copper, silver, or other metals, and/or graphite. In yet another embodiment, the antenna 216 is formed from plastic but has a metallic coating disposed thereon, such as a copper, aluminum, chrome, zinc or other useful material.

Figure 6:
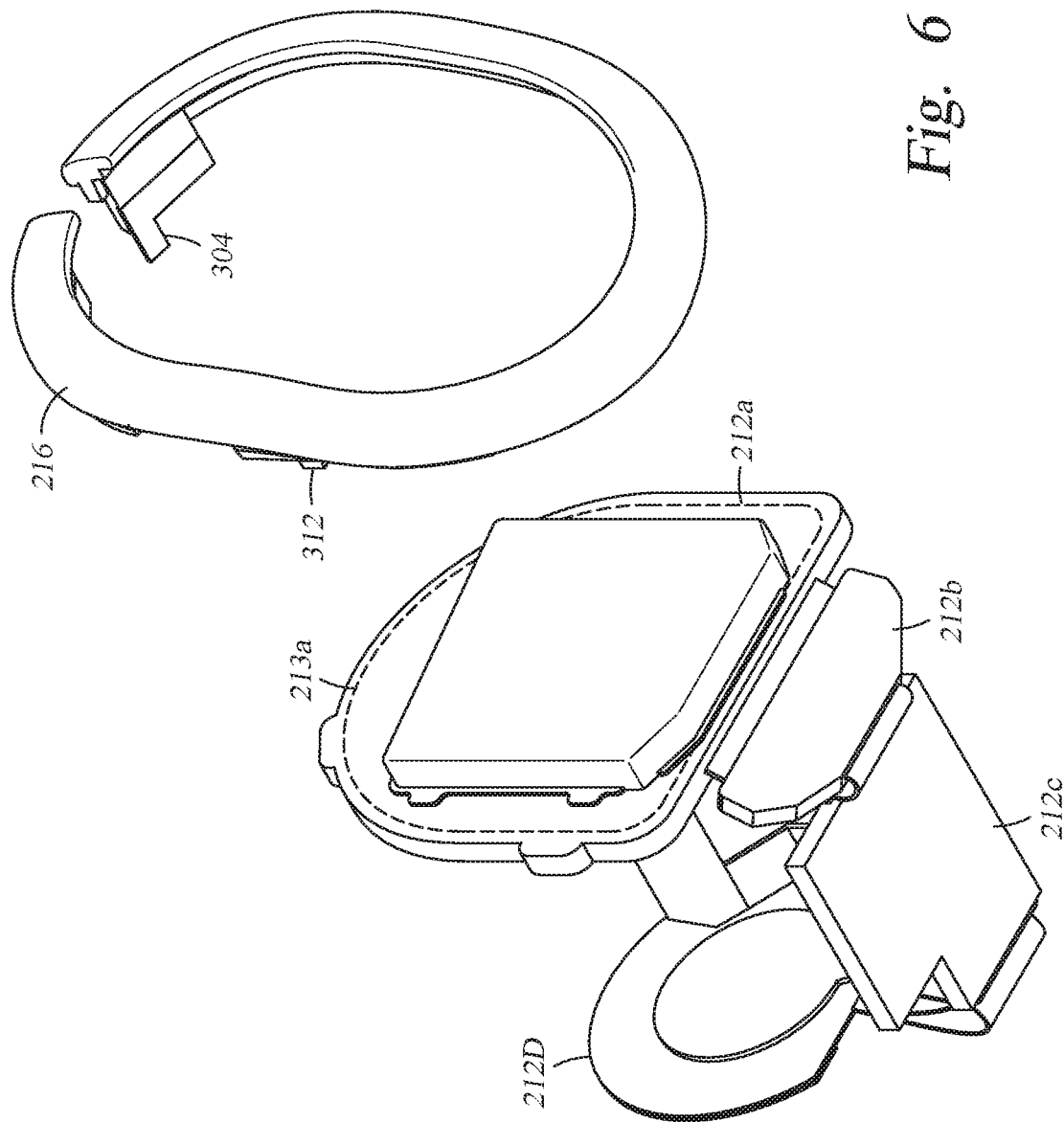
FIG. 6 depicts a first isometric view of the antenna in relation to the printed circuit boards, according to one or more embodiments of the present disclosure.

FIG. 6 depicts a first isometric view of the antenna 216 and the printed circuit boards 212a-212d of the printed circuit board assembly 212. As illustrated, some or all of the electrical components mounted on the printed circuit boards 212a-d are housed in grounded metal cans 602 to shield them from any interference caused by the electromagnetic signal driven on antenna 216 by the transceiver device during use or even from spurious ration from electrical components and circuits. In one embodiment, the metal cans are made from a highly magnetically permeable metal, such as iron. Also visible in FIGS. 4B and 6 is the beveling and tapering 604 of the antenna 216 at its outer circumference so as to smoothly fit into the cover 218 shown in FIG. 2.

Figure 7:
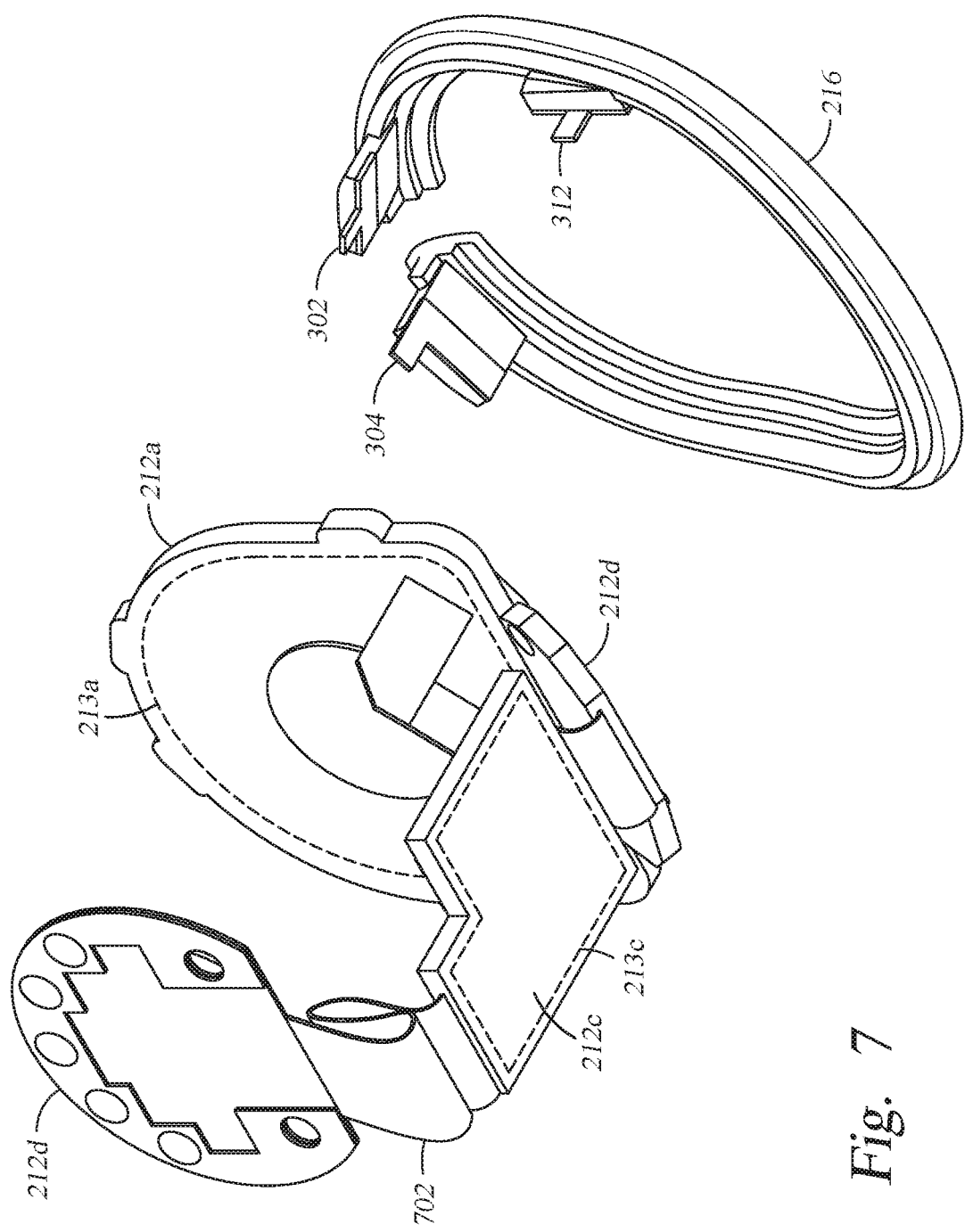
FIG. 7 depicts as second isometric view of the antenna in relation to the printed circuit boards, according to one or more embodiments of the present disclosure.

FIG. 7 depicts as second isometric view of the antenna and the printed circuit boards 212a-212d of the printed circuit board assembly 212. In this view, the connector printed circuit board 212d and central printed circuit board 212c and the connection 702 between them are more visible, along with the feed points 302, 304 on the antenna 216.

FIGS. 8A and 8B depict a first side view of the antenna and the printed circuit boards 212a-d respectively with and without the battery 214. In FIG. 8A, the complete printed circuit boards, battery and antenna assembly has an approximate length "g" of about 5 mm to about 20 mm. Depicted in FIG. 8B are the radial printed circuit board 212a, the switch printed circuit board 212b, the central printed circuit board 212c along the length of the battery 214, and the connector printed circuit board 212d and a connection 702 between the central printed circuit board 212c and the connector printed circuit board 212d. Also visible in FIGS. 8A and 8B is the general bow formed in the antenna 216. As noted above, the dimension "h", which can be between about 1 mm and about 10 mm, is the approximate distance between the antenna and the ground plane 213a within radial printed circuit board 212a.

Figure 9A:
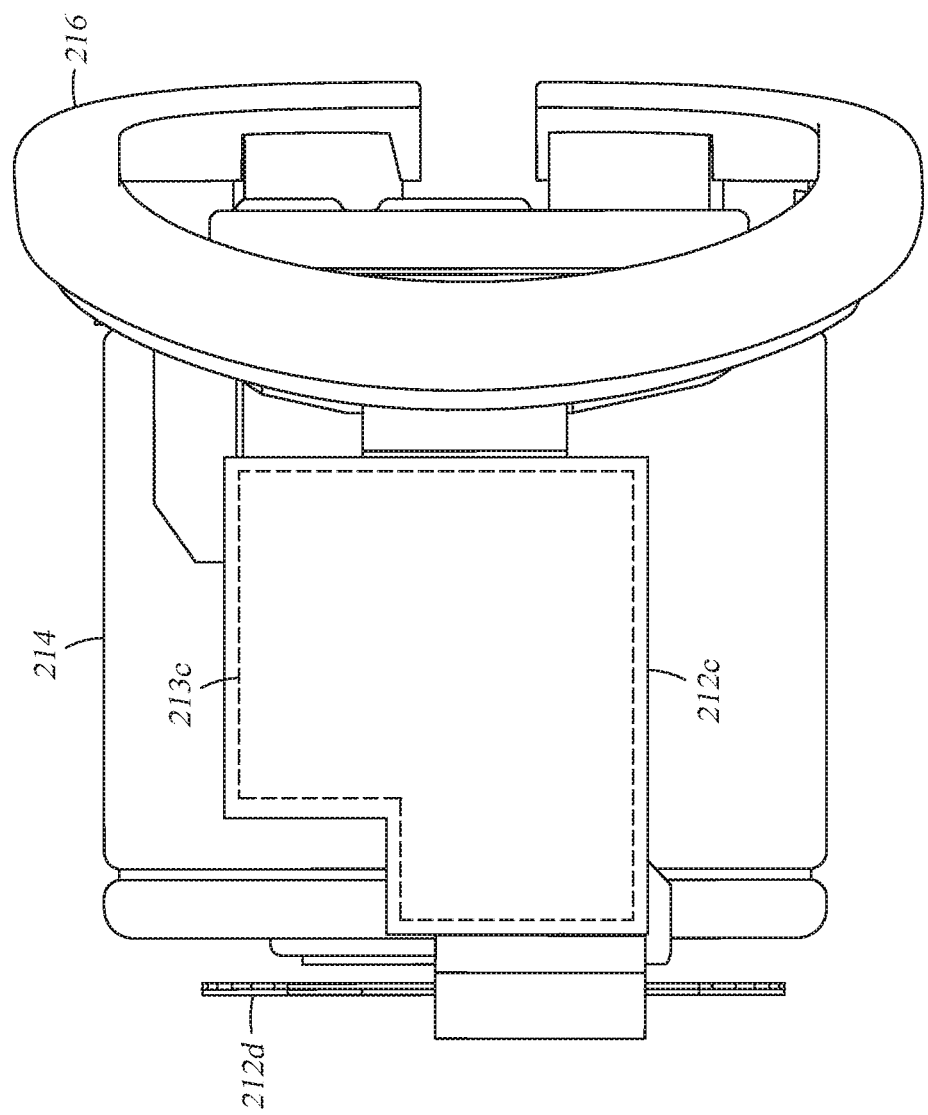

FIGS. 9A and 9B depict a second side view of the antenna, printed circuit boards respectively with and without the battery 214. In the view of FIG. 9A, the central printed circuit board 212c, the connector printed circuit board 212d and battery 214 are more clearly visible, with the central printed circuit board 212c being disposed along the length of the battery 214 as shown. In the view of FIG. 9B, the switch printed circuit board 212b, the central printed circuit board 212c, and the connector printed circuit board 212d are more clearly visible.

Figure 10A:
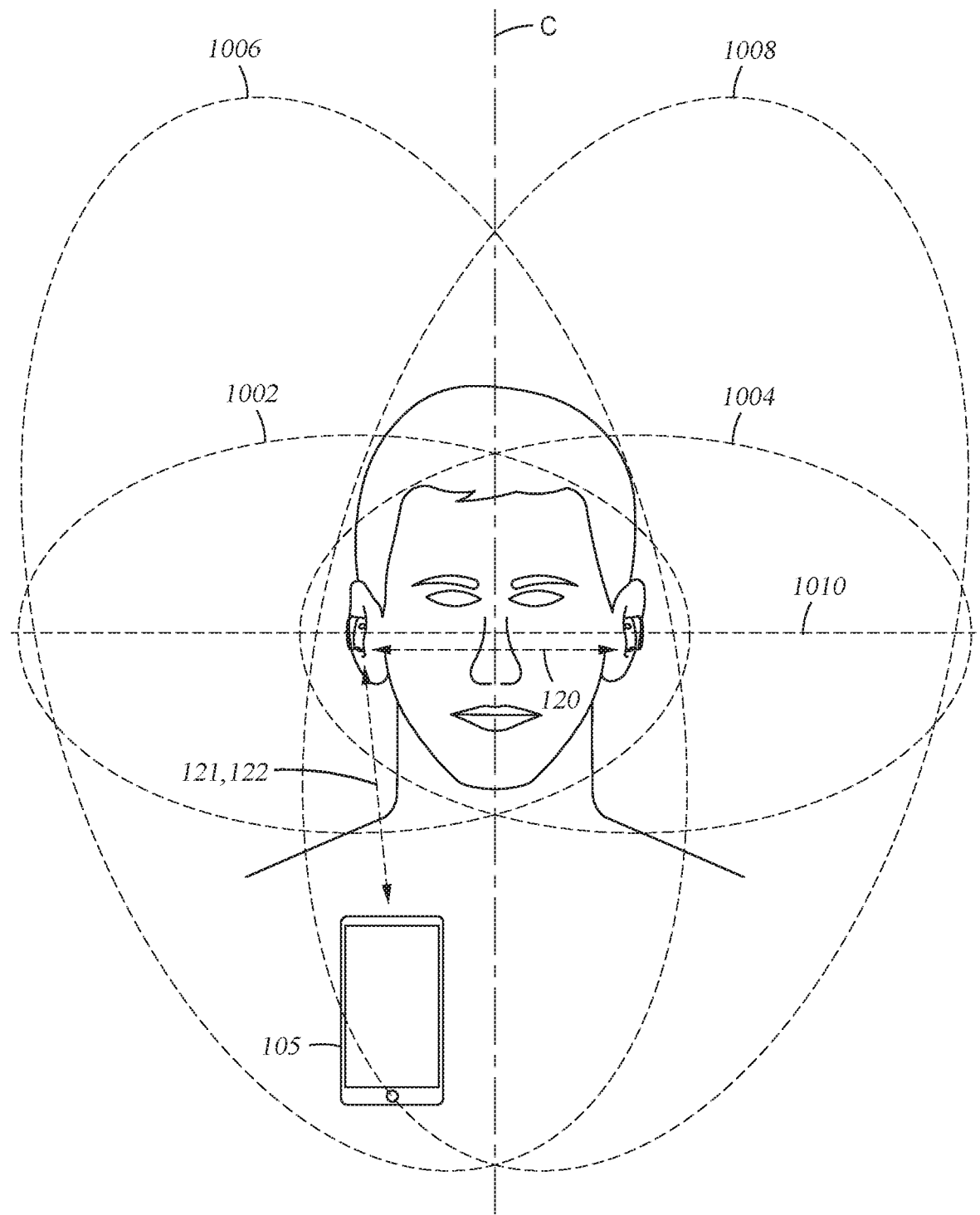
FIG. 10A depicts a first view of a radiation pattern about a user wearing two of the wireless devices, according to one or more embodiments of the present disclosure.
Figure 10B:
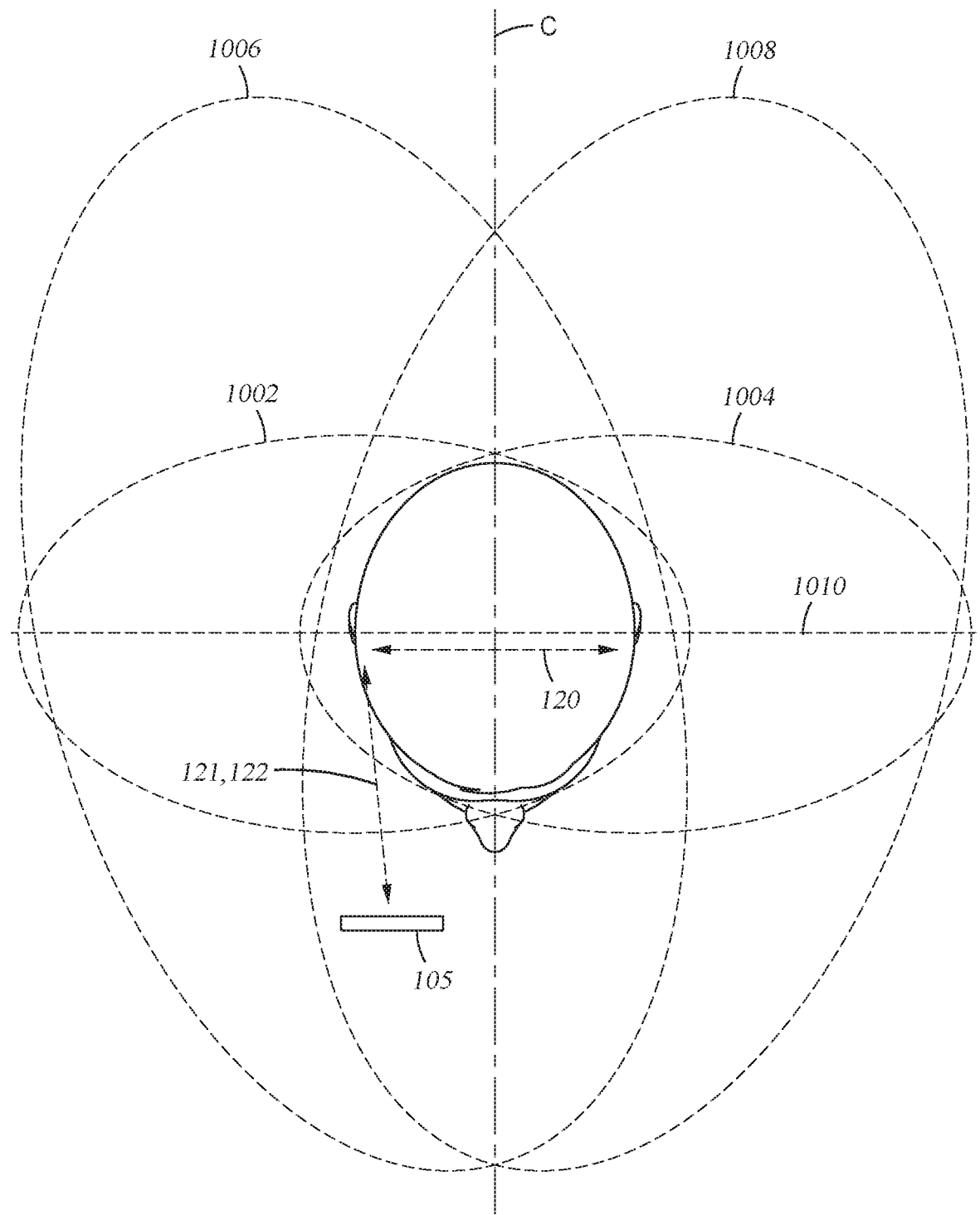
FIG. 10B depicts a second view of a radiation pattern about the user wearing two of the wireless devices, according to one or more embodiments of the present disclosure.

FIG. 10A depicts a radiation pattern about the head of the user wearing two of the wireless devices 101. The radiation pattern of the antenna within each wireless device 101 forms a principal lobe 1002, 1004 that is generally omni-directional in an azimuth plane 1010. Each antenna, when viewed as a dipole antenna, and disposed a distance "h" over the ground plane 213a (FIG. 8A) of the radial printed circuit board 212a gives rise to the omni-directional principal lobes 1002, 1004. The distance "h" between the antenna and the ground plane is such that the antenna and ground plane in each wireless device 101 interact to generate the resulting principal lobe. In one embodiment, the distance "h" between the antenna and the ground plane is about 2 mm to about 4.1 mm (e.g., 1/60 to 1/30 of a wavelength at the 2.44 GHz operating frequency). As each antenna has an omni-directional pattern in the azimuth plane 1010 of the antenna, the principal lobes 1002, 1004 overlap and combine to encircle the head of the user and enable a communication link 120 between each earpiece as shown in FIGS. 10A and 10B. The beam width of the principle lobes 1002, 1004 can be characterized by a spatial angle between the half-power points of the beam. In one embodiment, the half-power beam width of the principal lobe is about 87 degrees, and will generally depend on the antenna shape and/or orientation in space.

Each antenna also has a secondary lobe 1006, 1008 that extends approximately orthogonally and downwardly from the azimuth plane of primary lobe of the antenna. It is believed that the secondary lobe 1006, 1008 is formed by the interaction of the electromagnetic field generated by the antenna and the ground planes of the printed circuit boards 212a-212c. In particular, reflections of the antenna generated field by the ground plane disposed within the printed circuit board 212c, which is disposed along the length of the battery, combine with the other antenna generated fields to form the resulting secondary lobe. The non-planar nature of the antenna 216 as depicted in FIG. 5 also helps to contribute to the secondary lobes 1006, 1008. In one example, if the half-power beam width is about 87 degrees, the range of the secondary lobe will be about 10 meters, which is sufficient to form a communication link with a remote device that is disposed on or close to a user during normal use. However, it is believed that the bow of each of the antennas 216 has a greater effect on the directionality of the principal lobes 1002, 1004. In one embodiment, as illustrated in FIG. 10A, the plane 502 (FIG. 5) of the antenna, which is used to define the bow of the antenna 216, can be aligned so that plane 502 is oriented at an angle to the azimuth plane 1010 when the wireless device 101 is inserted within a user's ear. In one example, the plane 502 is oriented at an angle that is substantially perpendicular to the azimuth plane 1010.

FIG. 10B gives an isometric view of the principal lobes 1002 and 1004 created by antennas 216 about the antennas 216 in the ears of the user as well as the secondary lobes 1006, 1008 created by the antenna 216 and the 212b and 212c printed circuit boards, where the secondary lobes 1006, 1008 are approximately orthogonal to the azimuth plane 1010 of the principal lobes.

Figure 11:
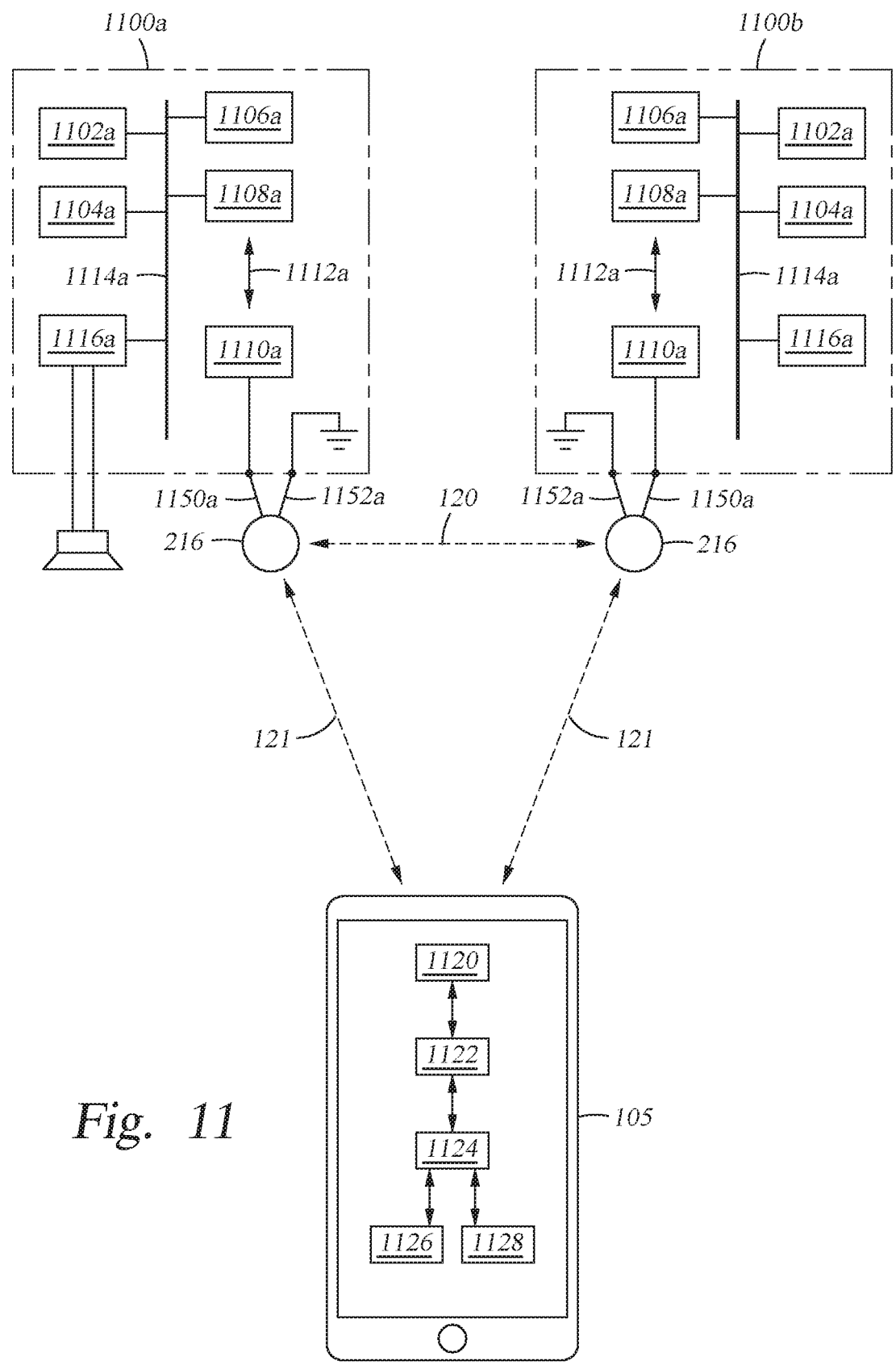
FIG. 11 depicts a block diagram of the electronic system for operating the wireless devices, according to one or more embodiments of the present disclosure.

FIG. 11 depicts a block diagram of the remote device 105 and the electronic systems 1100a, antennas 216 and speakers 1160a in each of earpieces. The remote device 105, which may include a smart phone, laptop computer, tablet, internet device, video player, gaming device, music playing platform or other types of devices, includes a processor 1124, volatile memory 1126 and non-volatile memory 1128, a wireless interface 1122 and a transceiver 1120, which communicates with the earpiece systems 1100a of each wireless device 101 via links 121 and 122.

The electronic system 1100a for an earpiece includes an electrical bus 1114a, a processor/CPU 1106a, a volatile memory 1102a and a non-volatile memory 1104a, a wireless interface 1108a, a speaker driver 1116a, and a transceiver 1110a.

The processor/CPU 1106a is coupled via the electrical bus 1114a to the volatile memory 1102a and non-volatile memory 1104a, the speaker driver 1116a and the wireless interface 1108a. The processor/CPU 1106a uses volatile memory 1102a as main memory and non-volatile memory 1104a as a repository of stored parameters and programs that can be loaded into main memory and executed by the processor/CPU 1106a. Stored programs run by the processor/CPU include those for managing the wireless interface 1108a to carry out the wireless communications protocol, e.g., Bluetooth. In one program, the processor/CPU 1106a handles receipt of data from the remote device 105 or other earpiece over the wireless interface 1108a and transceiver 1110a, coupled via 1112a, and converts the received data into an audible signal suitable for the speaker driver 1116a, which speaker driver uses to operate the speaker 1160a.

The speaker driver 1116a is mounted on the printed circuit board disposed over one of the faces of the battery and is coupled to the speaker assembly 204 of the wireless device 101 illustrated in FIG. 2, which contains the speaker 1160a.

In one embodiment, the transceiver 1110a on the radial circuit board 212a includes a voltage driver having a connection to one of the two feed points 302 in FIG. 4B of the antenna 216, the ground plane of the radial printed circuit board 212a having a connection to the other feed point 304. In this case, the connections are configured to cause the antenna to have a dipole-like operation because the ground plane on the radial printed circuit board is physically small and influenced by the driven pole connected to feed point 302. The driven pole induces a signal in the ground plane and this signal drives the other feed point 304 of the antenna, causing the dipole-like operation.

Transmission lines 1150a and 1152a are used to make the connections between the two feed points 302, 304 of the antenna 216 and the radial printed circuit board 212a, where the transmission lines have an impedance that is matched to the impedance of the antenna. In one embodiment, in which the antenna has an impedance of about 50 ohms between its feed points, the transmission lines are 50 ohm lines. Use of transmission lines prevents the connections between the radial printed circuit 212a board and the antenna 216 from radiating, thereby allowing the antenna 216 to more precisely control the radiation.

In one embodiment, the transmission lines 1150a, 1152a are formed by grounded metal printed under or over the connections between the transceiver driver 1110a and the antenna connection point 302, 304 or 312.

The embodiments described above thus provide for a wireless earpiece that is comfortable for the user and still efficient in its communicative coupling with both another earpiece and a remote device.

One embodiment of the disclosure may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A wireless wearable electronic device comprising:
   a printed circuit board assembly that includes a first printed circuit board having a first ground plane and a second printed circuit board having a second ground plane, wherein the second ground plane is electrically connected to the first ground plane and disposed at an angle from about 10° to about 170° to the first ground plane;
   a transceiver; and a driven antenna having a loop shape and a first feed point and a second feed point that are spaced a distance apart along the loop shape, wherein the antenna is disposed over the first ground plane and is coupled to the first ground plane at the first feed point and to the transceiver at the second feed point, and the first ground plane and the antenna are positioned to form a first gap therebetween.

2. The wireless wearable electronic device of claim 1, wherein the first gap and the position of the driven antenna relative to the first ground plane are adapted to form a principal radiation lobe that is parallel to a first plane when an electromagnetic radiation signal is provided to the driven antenna from the transceiver, and the second ground plane is positioned to form a secondary radiation lobe that is approximately orthogonal to the first plane.

3. The wireless wearable electronic device of claim 2, wherein the secondary radiation lobe has a half-power beam width of 87°.

4. The wireless wearable electronic device of claim 2, wherein the principle radiation lobe has a half-power beam width of 87°.

5. The wireless wearable electronic device of claim 2, wherein the driven antenna has a perimeter that is approximately 30 millimeters, and the electromagnetic radiation signal comprises a wavelength of about 125 millimeters.

6. The wireless wearable electronic device of claim 2, wherein the secondary radiation lobe is downwardly directed from the first plane.

7. The wireless wearable electronic device of claim 1, wherein the first gap between the driven antenna and the first ground plane is about 2 to about 4.1 millimeters.

8. The wireless wearable electronic device of claim 1, wherein the driven antenna is non-planar, and having a bow relative to a plane of the loop shape.

9. The wireless wearable electronic device of claim 8, wherein the bow has a radius of curvature of between about 20 mm and about 50 mm.

10. The wireless wearable electronic device of claim 1, wherein the driven antenna is fabricated from metal.

11. The wireless wearable electronic device of claim 1, wherein the driven antenna is fabricated from a non-metallic material and has conductive particles embedded therein.

12. The wireless wearable electronic device of claim 1, further comprising:

an additional printed circuit board assembly that includes a first printed circuit board having a first ground plane and a second printed circuit board having a second ground plane, wherein the second ground plane is electrically connected to the first ground plane and disposed at an angle to the first ground plane;

an additional transceiver; and an additional driven antenna having a loop shape and a first feed point and a second feed point that are spaced a distance apart along the loop shape, wherein the driven antenna and the additional driven antenna each have a bow relative to a plane.

13. The wireless wearable electronic device of claim 1, wherein the first ground plane and the driven antenna interoperate to form a principal radiation lobe that extends relative to a first plane, and the second ground plane and the driven antenna interoperate to form a secondary radiation lobe that is approximately orthogonal to the first plane.

14. The wireless wearable electronic device of claim 13, wherein the driven antenna has a perimeter that is approximately 30 millimeters, and the electromagnetic radiation signal comprises a wavelength of about 125 millimeters.

15. The wireless wearable electronic device of claim 13, wherein the first gap between the driven antenna and the first ground plane is about 2 to about 4.1 millimeters.

16. The wireless wearable electronic device of claim 1, wherein the driven antenna is non-planar and has a bow relative to a plane of the loop shape.

17. The wireless wearable electronic device of claim 1, wherein the driven antenna is fabricated from a non-metallic material and has conductive particles embedded therein.

18. The wireless wearable electronic device of claim 1, wherein the driven antenna has a second gap formed between the first and second feed points, wherein a portion of the driven antenna disposed between the first feed point and the second gap and a portion of the driven antenna disposed between the second feed point and the second gap are approximately equal.

19. The wireless wearable electronic device of claim 18, further comprising a pair of transmission lines that couple the feed points of the driven antenna to the transceiver and ground piano the first ground plane.

20. The wireless wearable electronic device of claim 1, wherein the first printed circuit board is disposed over a face of a battery, the second ground plane of the second printed circuit board is in electrical communication with the first ground plane, the second ground plane is disposed along a length of the battery, and the first gap and the position of the driven antenna relative to the first ground plane are adapted to form a principal radiation lobe that is parallel to a first plane when an electromagnetic radiation signal is provided to the driven antenna from the transceiver.

* * * * *